United States Patent [19]

Shimoda

[11] Patent Number: 5,171,698
[45] Date of Patent: Dec. 15, 1992

[54] METHOD OF FABRICATION OF MOS TRANSISTOR

[75] Inventor: Kouichi Shimoda, Tokyo, Japan

[73] Assignee: Oki Electric Industry Co., Ltd., Tokyo, Japan

[21] Appl. No.: 865,892

[22] Filed: Apr. 8, 1992

[30] Foreign Application Priority Data

Apr. 9, 1991 [JP] Japan .................................... 3-76506

[51] Int. Cl.$^5$ .......................................... H01L 21/335
[52] U.S. Cl. ...................................... 437/40; 437/69;
437/162; 437/238; 437/968
[58] Field of Search ................ 437/40, 162, 191, 238,
437/69, 70, 72, 73, 193; 357/23.11, 23.7, 59 E, 59 G

[56] References Cited

U.S. PATENT DOCUMENTS

4,978,629 12/1990 Komori et al. ................... 437/41
5,108,937 4/1992 Tsai et al. ........................ 437/40

FOREIGN PATENT DOCUMENTS

61-287171 12/1986 Japan ..................................... 437/40
63-211765 9/1988 Japan ..................................... 437/40
2-27770 1/1990 Japan ..................................... 437/40

*Primary Examiner*—T. N. Quach
*Attorney, Agent, or Firm*—Wenderoth, Lind & Ponack

[57] ABSTRACT

The method of fabricating a MOS transistor comprises the steps of successively forming a polycrystalline silicon film and a first silicon oxide film on a semiconductor substrate, forming a silicon nitride film on the first silicon oxide film on an element region, converting the polycrystalline silicon film on an element separation region into a second silicon oxide film, forming a second silicon oxide film on the side of the polycrystalline silicon film in the element region, forming a channel stopper layer underneath the element separation region of the semiconductor substrate, forming a third oxide film on the element separation region of the semiconductor substrate, and removing selectively the polycrystalline silicon, first silicon oxide film and the silicon nitride film to form a gate electrode forming region of the MOS transistor region.

7 Claims, 4 Drawing Sheets

METHOD OF FABRICATION OF MOS TRANSISTOR

BACKGROUND OF THE INVENTION

1. Field of the Invention:

The present invention relates to a method of fabricating a MOS transistor, particularly to a method of fabricating a MOS transistor which is excellent in high density and high speed.

2. Description of the Related Art:

In order to improve the integration of MOS integrated circuit devices, it has been vigorously carried out to reduce the dimensions of a Metal-Oxide-Semiconductor Field Effect Transistor (hereinafter referred to as a MOS transistor) element formed on a semiconductor substrate. A typical method for fabricating the MOS transistor is disclosed in the literature entitled "design of CMOS ultra LSI", pp 59 to 62, authored by Takuo Sugano and published on Apr. 25, 1989 by Baihukan.

SUMMARY OF THE INVENTION

It is an object of the present invention to provide a method of fabricating a MOS transistor having the width of the element separation silicon oxide film which is the same as that of a pattern used in the photolithographic process and capable of preventing a channel stopper layer from diffusing into an active region of the MOS transistor.

The method of fabricating the MOS transistor comprising the steps of forming a polycrystalline silicon film and a first silicon oxide film successively on a semiconductor substrate, forming first and second silicon nitride films on the first silicon oxide film on an element region, converting the polycrystalline silicon film between the first and second silicon nitride films into a second silicon oxide film acting as an element separating region, permitting the second silicon oxide film to remain between the element region and the element separating region, forming a channel stopper layer in the semiconductor substrate underneath the element separating region, forming a third silicon oxide film on the element separating region of the semiconductor substrate and eliminating a polycrystalline silicon film, the first silicon oxide film and the silicon nitride film which correspond to a gate electrode forming region in the element region.

BRIEF DESCRIPTION OF THE DRAWING

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENT

A method of fabricating the MOS transistor according to the present invention will be exemplarily described with reference to FIGS. 1(a) to 1(j).

Figure 1A:
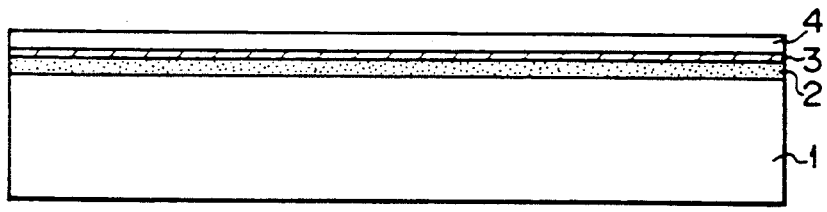
FIGS. 1(a) to 1(j) are views showing a process of fabricating a MOS transistor according to the present invention.

Referring to FIG. 1(a), a polycrystalline silicon film 2 of a thickness of 2000 Å is formed on a surface of a 1 to 2 Ωcm P-type semiconductor substrate by a low-pressure chemical vapor deposition LPCVD method. Successively, a silicon oxide film 3 of a thickness of 200 Å is formed on the polycrystalline silicon film 2 by subjecting the polycrystalline silicon film 2 to an oxidizing process at a temperature of 900° C. for 30 minutes. Furthermore, a silicon nitride film 4 is formed to a thickness of 1000 Å on the silicon oxide film 3.

Figure 1B:
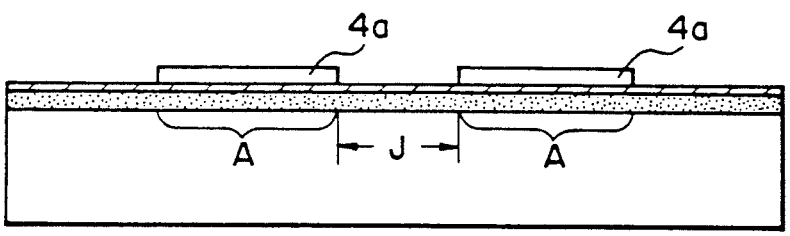

The silicon nitride film 4 on the place where an element separation region J is to be formed is removed by a photolithography technique whereby the silicon nitride films 4a remain on MOS transistor forming regions A (element region) (refer to FIG. 1(b)).

A silicon oxide film 5 is formed on the element separation region J by performing a high-pressure oxidation under a pressure of 7 kg/cm$^2$ at a temperature of 1030° C. for 15 minutes. Polycrystalline silicon films 2a remain under the silicon nitride films 4a without being subjected to the oxidation (refer to FIG. 1(c)).

The silicon oxide film 5 is etched anisotropically by performing a reactive ion etching (RIE) using the silicon nitride films 4a as masks. As a result, the silicon oxide films 5a remain on the side portion of the polycrystalline silicon film 2a (refer to FIG. 1(d)).

Silicon oxide films 6 are formed to a thickness of 200 Å by oxidation at a temperature of 900° C. for 30 minutes. Successively, boron ions are implanted into the semiconductor substrate 1 under the condition that an implantation energy is 10 keV and an impurity concentration is $3 \times 10^{13}$ ions/cm$^2$. Still furthermore, the implanted boron ions are diffused by subjecting the semiconductor substrate 1 to annealing at temperature of 900° C. for 30 minutes, whereby a channel stopper layer 7 are formed under the silicon oxide 6 (refer to FIG. 1(e)).

A silicon oxide film is formed to a thickness of 6000 Å by a CVD process. Then, a photo-resist is coated on the entire surface of the silicon oxide film in a thickness of 8000 to 10,000 Å (not shown). A silicon oxide film 8 is formed by subjecting the photo-resist and the silicon oxide film to etchback until the surface of the silicon nitride film 4a is exposed. The remaining photo-resist is removed completely (refer to FIG. 1(f)).

Phosphorus ions are implanted into the polycrystalline silicon film 2a under the implantation energy 150 keV at an impurity concentration of $8 \times 10^{15}$ ions/cm$^2$ using the silicon oxide film 8 as a mask. Thereafter, the silicon nitride film 4a, the silicon oxide film 3 and the polycrystalline silicon film 2a are partially etched to form a gate electrode region, by using a photolithography technique. The gate silicon oxide film 9 of a thickness of 180 Å is formed by oxidation for 10 minutes at a temperature of 850° C. (refer to FIG. 1(g)).

Next, a polycrystalline silicon film 10 is formed on the surface of the gate silicon oxide film 9 to a thickness of 3000 Å by an LPCVD. Thereafter, the phosphorus ions are diffused into the polycrystalline silicon film 10 so that the phosphorus concentration becomes $6 \times 10^{20}$ cm$^{-3}$ to $1 \times 10^{21}$ cm$^{-3}$. A diffusing temperature at this step is 900° C. The polycrystalline silicon film 10 which serves as the gate electrode is formed by a photolithographic technique. A silicon oxide film 11 is grown to a thickness of 800 Å by oxidation at a temperature of 900° C. for 15 minutes. The phosphorus ions in the polycrystalline silicon film 2a are diffused into the semiconductor substrate 1 through the heat oxidation process whereby source and drain layers 12 are formed in the MOS transistor region (refer to FIG. 1(h)).

The silicon nitride film 4a are etched using the silicon oxide films 8 and 11 as masks. A hot phosphoric acid is used as an etchant. The silicon nitride films 4b remain under the silicon oxide film 11 and the polycrystalline silicon film 10 (refer to FIG. 1(i)).

The silicon oxide films 3 on the polycrystalline silicon films 2a are etched off using the silicon nitride films 4b as masks. Then an aluminum is deposited on the entire surface of the obtained structure to a thickness of 6000 Å. Thereafter, source and drain electrodes 13 are formed by removing selectively the aluminium layer through the photolithography technique (refer to FIG. 1(j)).

As is explained in detail above, the following advantages can be obtained according to the preferred embodiment of the present invention.

Figure 1C:
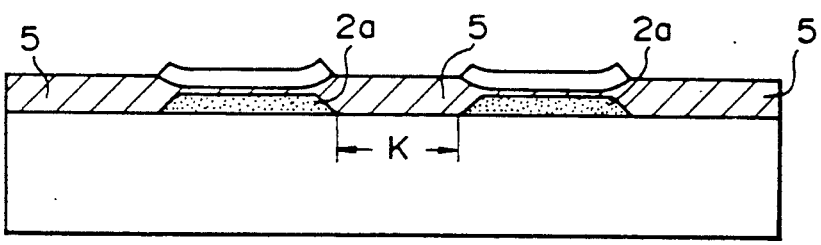
Figure 1D:
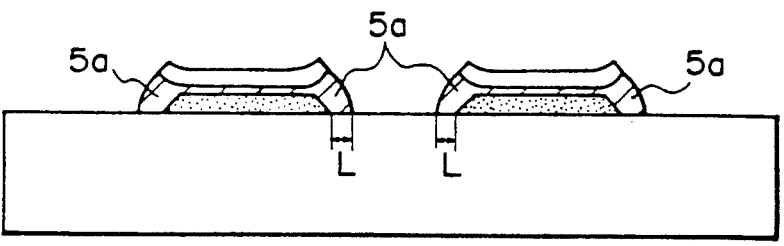
Figure 1E:
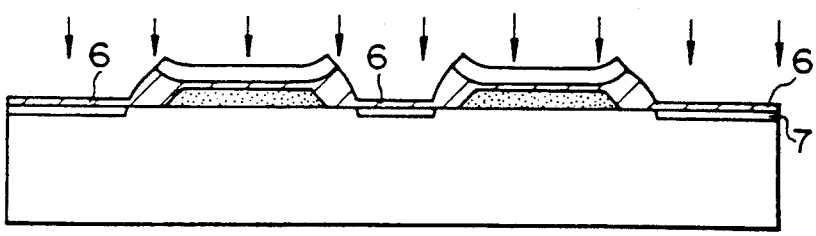
Figure 1F:
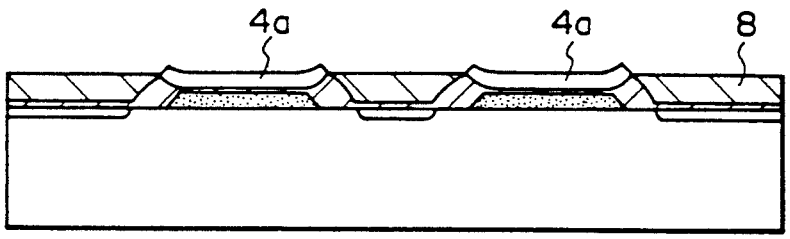
Figure 1G:
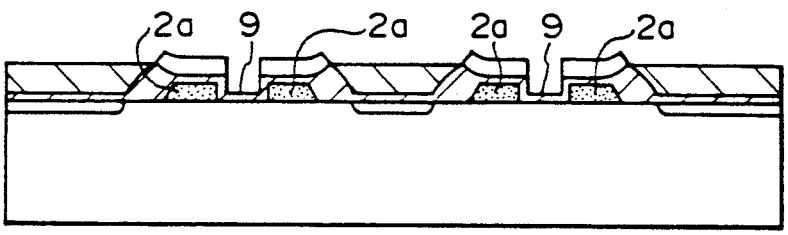
Figure 1H:
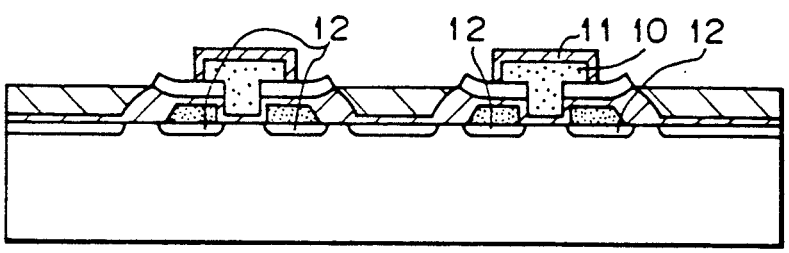

(1) The element separation silicon oxide film can be formed by oxidizing the polycrystalline silicon film. The width of thus obtained element separation silicon oxide film can be defined accurately in accordance with a mask pattern used in the photolithography process. Suppose that the width of an element separation region defined by the photolithography process is, e.g. 1.0 μm as illustrated in FIGS. 1(b) and 1(c) (maximum resolution of photolithography). The width of the thus obtained element separation region becomes 1.0 to 1.1 μm.

(2) The channel stopper layer is formed by etching the element separation silicon oxide film 5 using the silicon nitride films 4a as the masks after the formation of the element separation silicon oxide film 5. Since the source and drain layers 12 are separated from the channel stopper layers 7 each by the width of L which corresponds to the width of the element separation silicon oxide film 5a, the channel stopper layers 7 are prevented from diffusing into the active region of the MOS transistor. Since the channel stoppers 7 also are separated from the source and drain layers 12, the threshold voltage of the MOS transistor is not varied and the junction breakdown voltage is not deteriorated.

Figure 1I:
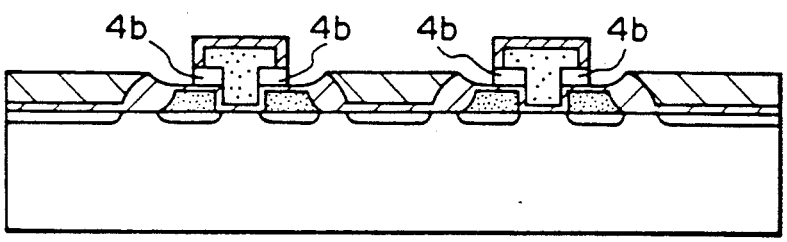
Figure 1J:
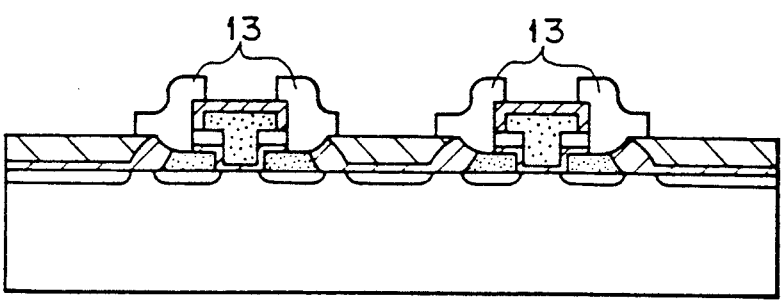

(3) Since the source and drain layers 12 are formed so as to overlap the polycrystalline silicon films 10 forming the gate electrodes and the contact hole extending to the source and drain layers 12 are formed by the self-alignment process as illustrated in FIGS. 1(i) to (j), the MOS transistor forming region can be reduced.

Suppose that the maximum resolution of photolithography is, e.g. 1.0 μm, the mask alignment margin is, e.g. 0.3 μm, and the mask alignment is effected successively on the source and drain layers 12 and the gate electrode.

Figure 3:
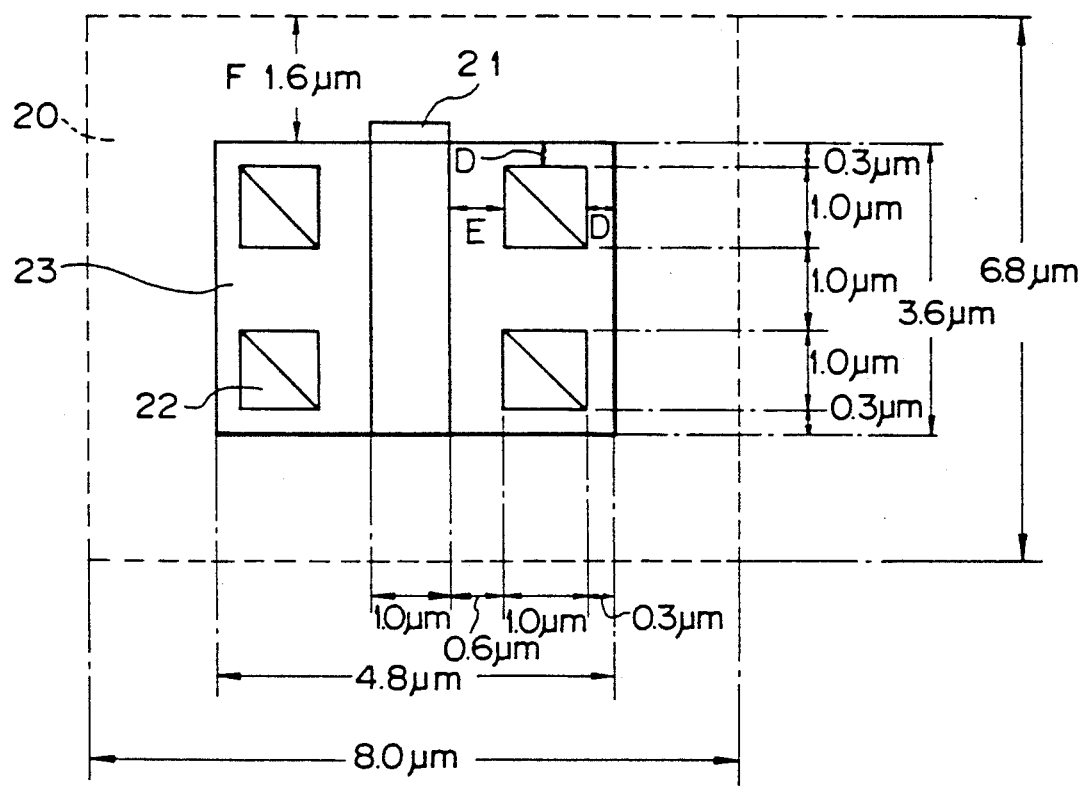
FIG. 3 is a plan view showing the dimensions of a conventional MOS transistor.

A conventional MOS transistor formed by the mask alignment set forth above is illustrated in FIG. 3 as a plan view. A mask alignment margin E between a gate 21 and a contact 22 in an element separation region 20 is 0.6 μm while a mask alignment margin D between source and drain regions 23 and a contact 22 is 0.3 μm. Supposing that the width of the gate is 1.0 μm, the area of the region for forming the MOS transistor E becomes 3.6 μm×4.8 μm which equals to 17.28 μm².

Figure 2:
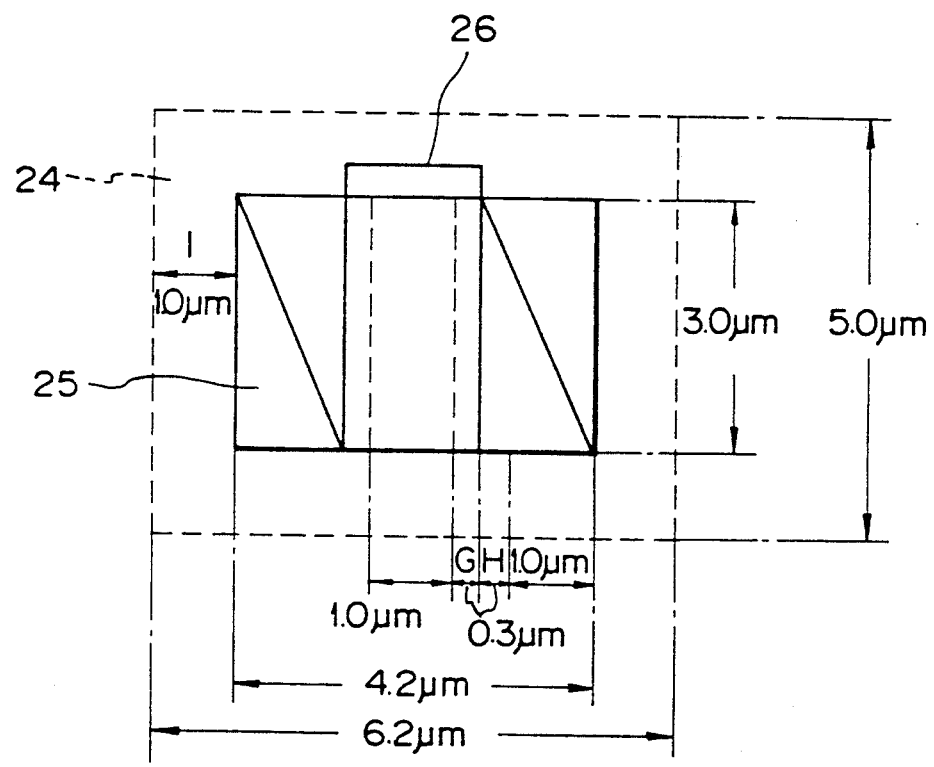
FIG. 2 is a plan view showing the dimensions of the MOS transistor according to the present invention.

Whereupon, the MOS transistor formed by the mask alignment set forth above according to the present invention is illustrated in FIG. 2 as a plan view. A mask alignment margin H between source and drain regions 25 and a gate 26 in the element separating region 24 is 0.3 μm while a mask alignment margin D between the source and drain regions 23 and the contact 22 is 0.3 μm. Supposing that the overlapped portion G between the gate 26 and the source and drain regions 25 is 0.3 μm, the area of the region for forming the MOS transistor becomes 3.0 μm×4.2 μm which equals to 12.6 μm².

It is possible to reduce the MOS transistor forming region by 27% according to the present invention compared with that of the conventional MOS transistor. The area of the conventional MOS transistor including the element separation region becomes 6.8 μm×8.0 μm which equals to 54.4 μm² since the width F of the element separation region is 1.6 μm.

Whereupon, the area of the MOS transistor according to the present invention is 5.0 μm×6.2 μm which equals to 31.0 μm² since the width I of the element separation region is 1.0 μm. Accordingly, it is possible to reduce the MOS transistor forming area of the present invention by about 43% compared with the conventional one.

According to the method of fabricating MOS transistors according to the present invention, it is possible to equalize the width of the element separation silicon oxide film practically formed on the substrate, with the width of the element separation silicon oxide film defined by a photolithography process. The channel stopper layer is prevented from diffusing into the active region of the MOS transistor. Furthermore, the area of the MOS transistor can be reduced further.

As a result, it is possible to fabricate high speed and highly shrunken MOS transistors.

While the invention has been particularly shown and described with reference to preferred embodiments thereof, it will be understood by those skilled in the art that various changes in form and details may be made therein without departing from spirit and scope of the invention.

What is claimed is:

1. A method of fabricating a MOS transistor comprising the steps of:
   (a) preparing a semiconductor substrate having a first element forming region, a second element forming region and an element separation forming region disposed horizontally between the first and the second element forming regions;
   (b) successively forming a polycrystalline silicon film and a first silicon oxide film on the semiconductor substrate;
   (c) forming a silicon nitride film on the first silicon oxide film above each of the first and second element forming regions;
   (d) converting the polycrystalline silicon film and the first silicon oxide film located above the element separation forming region into a second silicon oxide film acting as an element separation region;
   (e) selectively removing the second silicon oxide film located above the element separation forming region such that opposite end portions of the second silicon oxide film remain adjacent to the polycrystalline silicon film located above each of the first and second element forming regions;
   (f) forming a channel stopper layer in the element separation forming region of the semiconductor substrate;

(g) forming a third silicon oxide film on the element separation forming region and adjacent to the remaining opposite end portions of the second silicon oxide film of the semiconductor substrate; and (h) selectively removing the polycrystalline silicon, the first silicon oxide film and the silicon nitride film respectively to form a gate electrode forming region above each element forming region.

2. A method according to claim 1, wherein the step (e) comprises etching the second silicon oxide film using the silicon nitride film as a mask.

3. A method according to claim 1 further including the step of implanting ions into the polycrystalline silicon film after the completion of the step (g).

4. A method according to claim 1, wherein the step (d) is carried out by a high-pressure oxidation process.

5. A method according to claim 4, wherein ions are implanted into the polycrystalline silicon film, and source and drain layers are formed in the semiconductor substrate immediately under the polycrystalline silicon film by a heat diffusion from the polycrystalline silicon film.

6. A method of fabricating a MOS transistor according to claim 1 further comprises the steps of:

(a) forming a gate oxide on the semiconductor substrate which is exposed by the removing step (h);

(b) forming a gate electrode on the gate electrode forming region wherein the gate electrode extends to a part of the silicon nitride film;

(c) covering the gate electrode by a fourth silicon oxide film;

(d) removing the silicon nitride film using the fourth silicon oxide film as a mask, wherein the silicon nitride film immediately under the gate electrode and the fourth silicon oxide film remain;

(e) removing the first silicon oxide film on the polycrystalline silicon film using the remaining silicon nitride film as the mask; and (f) forming source drain electrodes on the polycrystalline silicon film.

7. A method according to claim 6, wherein the fourth silicon oxide film in the step (c) is formed by heat oxidation.

* * * * *